(12) United States Patent
Hosaka et al.

(10) Patent No.: US 7,897,958 B2
(45) Date of Patent: Mar. 1, 2011

(54) PHASE-CHANGE MEMORY DEVICE, PHASE-CHANGE CHANNEL TRANSISTOR, AND MEMORY CELL ARRAY

(75) Inventors: Sumio Hosaka, Takasaki (JP); Hayato Sone, Midori (JP); Masaki Yoshimaru, Hachioji (JP); Takashi Ono, Hachioji (JP); Mayumi Nakasato, Gifu (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 734 days.

(21) Appl. No.: 11/882,582

(22) Filed: Aug. 2, 2007

(65) Prior Publication Data

US 2008/0049490 A1  Feb. 28, 2008

(30) Foreign Application Priority Data

Aug. 2, 2006  (JP) .................. 2006-211262

(51) Int. Cl.
*H01L 47/00* (2006.01)
(52) U.S. Cl. ............... 257/4; 257/2; 257/3; 257/E45.002
(58) Field of Classification Search .................. 257/2–4, 257/E45.002
See application file for complete search history.

(56) References Cited

U.S. PATENT DOCUMENTS

| | | | |
|---|---|---|---|
| 6,961,277 B2 * | 11/2005 | Moore et al. | 365/222 |
| 2004/0113135 A1 * | 6/2004 | Wicker | 257/2 |
| 2006/0077706 A1 * | 4/2006 | Li et al. | 365/163 |

FOREIGN PATENT DOCUMENTS

| | | |
|---|---|---|
| JP | 2005-93619 | 4/2005 |
| JP | 2006-511973 | 4/2006 |
| WO | 2004/057676 | 7/2004 |

OTHER PUBLICATIONS

Japanese Office Action issued on Oct. 16, 2008 in corresponding Japanese Patent Application No. 2006-211262.

* cited by examiner

*Primary Examiner* — Kiesha R Bryant
*Assistant Examiner* — Tucker Wright

(57) ABSTRACT

To reduce the voltage required to cause a phase transition from an amorphous phase to a crystalline phase, a phase-change memory device (1) comprises: a first electrode (6); a second electrode (8); and a memory layer (14) provided between the first (6) and second (8) electrodes, wherein the memory layer (14) includes at least a first layer (10) formed from a phase-change material which is stable in either the amorphous phase or the crystalline phase at room temperature, and a second layer (12) formed from a resistive material, and wherein the resistance value of the second layer (12) is smaller than the resistance value of the first layer (10) in the amorphous phase, but is larger than the resistance value of the first layer (10) in the crystalline phase.

5 Claims, 8 Drawing Sheets

(A)

(B)

(A)

(B)

(A)

(B)

(A)

(B)

PHASE-CHANGE MEMORY DEVICE, PHASE-CHANGE CHANNEL TRANSISTOR, AND MEMORY CELL ARRAY

CROSS-REFERENCE TO RELATED APPLICATION

This application claims priority of Japanese Patent Application No. 2006-211262, filed on Aug. 2, 2006.

FIELD OF THE INVENTION

The present invention relates to a phase-change memory device and a phase-change channel transistor, each using a material that is stable in either a crystalline phase or an amorphous phase at room temperature, and also relates to a memory cell array constructed by interconnecting such devices or transistors.

BACKGROUND OF THE INVENTION

A chalcogenide-based material, for example, has the property of being stable in either a crystalline phase or an amorphous phase at room temperature, and its resistivity changes by two to four orders of magnitude between the two phases. A nonvolatile memory is realized by making use of this property. In other words, information is written by setting a thin film of such a material, which is stable in either the crystalline or the amorphous phase, and the information is read by detecting, through the measurement of its resistance value, whether the thin film is in the crystalline phase or the amorphous phase.

When writing information, i.e., an 1 or an 0, to such a memory, the thin film of the phase-change material must be made to undergo a phase change from crystalline to amorphous or from amorphous to crystalline. Generally, a chalcogenide-based material solidifies into an amorphous phase when the material is heated to 630° C. or higher and then quickly cooled. On the other hand, when the material is heated to 200° C. or higher and then gradually cooled, it stabilizes in a crystalline phase. The thin film of the phase-change material is heated by using the Joule heat generated when a current flows through the thin film. When the thin film of the phase-change material has changed to an amorphous phase, the resistance value of the thin film is two to four orders of magnitude larger than that when it has changed to the crystalline phase. Accordingly, by applying a read voltage to the thin film of the phase-change material and detecting the amount of current that flows, it can be determined in which phase, the amorphous or the crystalline phase, the thin film remains stable, thus enabling written information to be read out.

Recently, it has been found that, in this kind of phase-change thin film, the amount of current can be controlled by applying a bias voltage perpendicular to the flow direction of the current, and by doing so, a phase-change channel transistor having a memory function as well as a switching function has been proposed (Japanese Unexamined Patent Publication No. 2005-93619). In this phase-change channel transistor, the memory function is achieved by forming the channel portion from a phase-change material, and the information read/write timing can be controlled by switching the current flowing through the channel portion on and off by gate voltage. When RAM is constructed using such phase-change channel transistors, each select transistor and its associated memory part can be implemented in a single transistor, and an ultra high-density storage device can be achieved. In a traditional DRAM, on the other hand, each memory cell comprises a select transistor and a memory element formed from a capacitor, and the area of the memory cell increases because of the need to fabricate the capacitor on a semiconductor substrate, which has been a factor impeding device miniaturization. Therefore there has been a limit to the extent to which memory cell density can be increased.

In a phase-change channel transistor, as well as in a phase-change memory, when writing information the phase-change material layer must be made to undergo a phase change. To effect this phase change, Joule heat must be generated by flowing a current through the thin film of the phase-change material. However, for a phase change from an amorphous to crystalline phase, considerably high voltage must be applied in order to heat the material to a temperature required to cause a phase change, because in the amorphous phase, electrical resistance is high and current does not easily flow. As a result, write voltage to the memory device increases. Furthermore, when the material has changed from an amorphous to crystalline phase, since the resistance is low in the crystalline phase, excessive current flows through the material because of high voltage, and the device may break down.

To prevent this, there is a need to reduce the amount of resistance in the amorphous state of the phase-change material, thereby reducing the voltage to be applied for a phase change from the amorphous to the crystalline phase. It is desirable that the change in resistance between the amorphous and crystalline phases, which, with the present state of the art, is as large as two to four orders of magnitude, be reduced to one order of magnitude or less. However, phase-change materials that can satisfy such requirements have not been developed yet.

SUMMARY OF THE INVENTION

The present invention has been devised to solve the above problem, and an object of the invention is to provide a phase-change memory device and a phase-change channel transistor of a novel structure that can reduce the amount of applied voltage required to cause a phase change from amorphous to crystalline without modifying the phase-change material itself. It is also an object of the invention to provide a memory cell array constructed by interconnecting such devices.

To solve the above problem, a memory device according to a first invention comprises: a first electrode; a second electrode; and a memory layer provided between the first and second electrodes, wherein the memory layer includes at least a first layer formed from a phase-change material which is stable in either an amorphous phase or a crystalline phase at room temperature and a second layer formed from a resistive material, and wherein the resistance value of the second layer is smaller than the resistance value of the first layer in the amorphous phase, but is larger than the resistance value of the first layer in the crystalline phase.

When forming the first and second electrodes and the memory layer on an insulating film formed on a semiconductor substrate, the first layer may be formed on the insulating film, and the second layer may be formed on top of it, or the order of the first and second layers may be interchanged. In that case, a third layer formed from a resistive material may be formed on top of the first layer formed from the phase-change material. Further, the first layer as the phase-change material layer and the second layer as the resistive layer may be formed in parallel and adjacent to each other between the first and second electrodes.

A phase-change channel transistor according to a second invention comprises: a first electrode; a second electrode; a memory layer provided between the first and second electrodes; and a third electrode provided for the memory layer with an insulating film interposed therebetween, wherein the memory layer includes at least a first layer formed from a phase-change material which is stable in either an amorphous phase or a crystalline phase at room temperature and a second layer formed from a resistive material, and wherein the resistance value of the second layer is smaller than the resistance value of the first layer in the amorphous phase, but is larger than the resistance value of the first layer in the crystalline phase.

The first and second layers may be stacked one on top of the other vertically between the first and second electrodes, or may be formed in parallel and adjacent to each other between the first and second electrodes. The third electrode may be formed on a semiconductor substrate, and the first and second electrodes and the memory layer may be formed on an insulating film which is formed on the semiconductor substrate so as to cover the third electrode. Alternatively, the first and second electrodes and the memory layer may be formed on a first insulating film formed on the semiconductor substrate, and the third electrode may be formed on a second insulating film formed on the memory layer.

Further, either a first voltage which shuts off current flowing through the memory layer when voltage is applied between the first and second electrodes, or a second voltage which does not shut off current may be selectively applied to the third electrode in order to cause the phase-change channel transistor to function as a switching device.

A memory cell array according to a third invention is constructed by arranging a plurality of memory cells on a single substrate, each of the memory cells comprising a single MOS transistor and a memory part containing a phase-change material layer which is stable in either an amorphous phase or a crystalline phase at room temperature, wherein the memory part is formed from the phase-change memory device according to the first invention.

A memory cell array according to a fourth invention is constructed by arranging a plurality of phase-change channel transistors according to the second invention on a single substrate.

In the phase-change memory device according to the first invention and the phase-change channel transistor according to the second invention, since the memory layer is constructed by stacking the phase-change layer and the resistive layer one on top of the other in a direction perpendicular to a direction extending between the first and second electrodes or by forming the two layers in parallel and adjacent to each other between the first and second electrodes, when voltage is applied between the first and second electrodes, the combined resistance of the memory layer becomes almost the same as the resistance value of the resistive layer when the phase-change material layer is in the amorphous phase, but becomes almost the same as the resistance value of the phase-change material layer when the phase-change material layer is in the crystalline phase. Accordingly, when the resistance value of the resistive layer is chosen to be smaller than the resistance value that the phase-change material layer exhibits when in the amorphous phase, the combined resistance decreases, allowing a larger current to flow through the resistive layer. As a result, the resistive layer easily generates heat, and with this heat, the phase-change material layer in the amorphous phase is heated and thus undergoes a phase change.

In this way, by forming the memory layer in a stacked structure comprising the phase-change material layer and the resistive layer, the combined resistance of the entire memory layer can be reduced, and as a result, the amorphous to crystalline phase change of the phase-change material layer can be accomplished with lower applied voltage, thus achieving a practical phase-change memory device or a phase-change channel transistor.

Further, by arranging a plurality of such phase-change memory devices or phase-change channel transistors, a memory cell array can be constructed that can be driven with lower voltage. In particular, in the case of a memory cell array constructed by interconnecting such phase-change channel transistors, since each switching transistor and its associated memory part, which have had to be formed as separate elements in the prior art, can be implemented in a single transistor, in which the area each memory cell occupies on the substrate greatly decreasing, and an ultra high-density memory cell array can thus be achieved.

BRIEF DESCRIPTION OF THE DRAWINGS

The above object and features of the present invention will be more apparent from the following description of some preferred embodiments with reference to the accompanying drawings, wherein.

DESCRIPTION OF THE PREFERRED EMBODIMENTS

Embodiment 1

Figure 1:
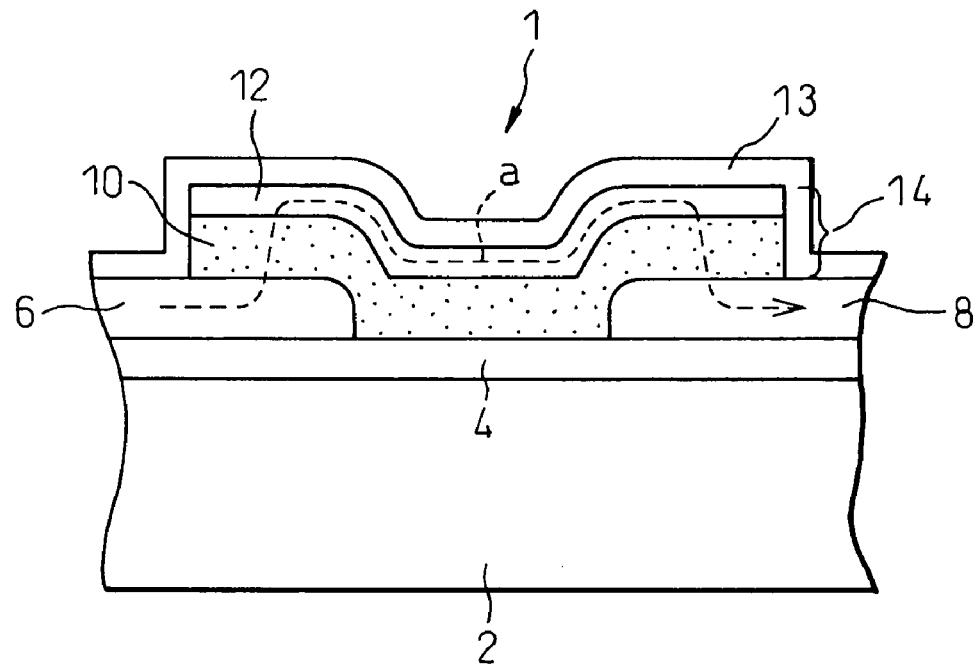
FIG. 1(A) is a cross-sectional view of a phase-change memory device according to a first embodiment of the present invention when a phase-change material layer is in an amorphous phase.
FIG. 1(B) is a cross-sectional view of the phase-change memory device according to the first embodiment of the present invention when the phase-change material layer is in a crystalline phase.
Figure 1:
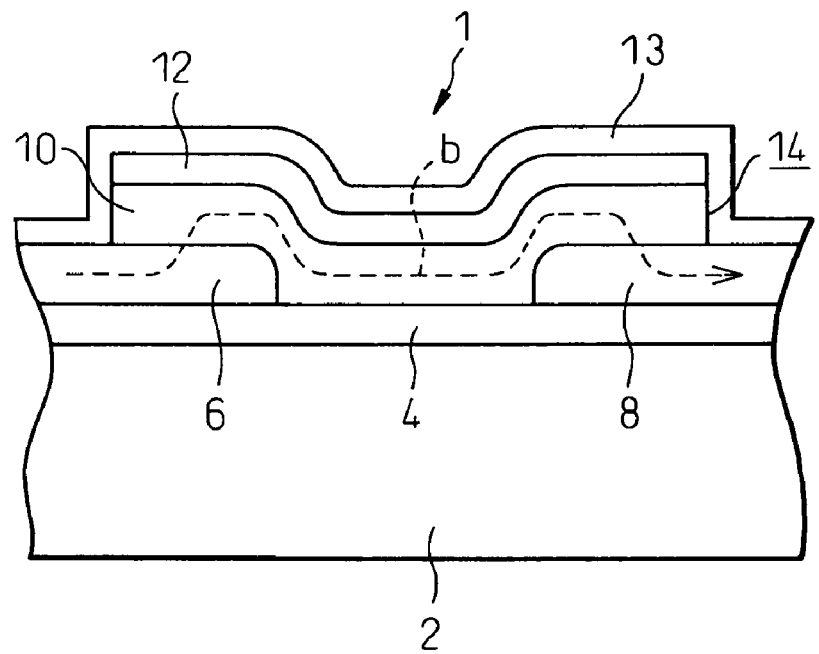

FIGS. 1(A) and 1(B) are partial cutaway cross-sectional views showing the structure of a stacked-type phase-change memory device 1 according to a first embodiment of the present invention. Part (A) shows the case where the phase-change material layer is in an amorphous phase, and Part (B) the case where the phase-change material layer is in a crystalline phase. In parts (A) and (B) of the figure, reference numeral 2 is a semiconductor substrate of Si, 4 is an insulating layer made of $SiO_2$ or the like, 6 and 8 are first and second electrode layers made of Al, Au, or the like, 10 is a layer made of a phase-change thin film (hereinafter called the phase-change material layer) formed from a material such as chalcogenide commonly used in a phase-change memory, and 12 is a resistive layer made of C, W, or the like. The phase-change material layer 10 and the resistive layer 12 together constitute a memory part 14 of the phase-change memory device 1. Reference numeral 13 is a protective layer formed, for example, from $SiO_2$ or the like for covering the memory part 14.

Chalcogenide is a GeSbTe-based or AgInSbTe-based material containing at least Sb and Te, and is stable in either the amorphous or the crystalline phase at room temperature. In one example, when the material takes the amorphous phase, its resistivity ρ is about 1 Ωm, and when it takes the crystalline phase, on the other hand, the resistivity ρ is about $10^{-4}$ Ωm. Therefore, when the layer 10 is in the amorphous phase, its resistance value is larger by a factor of 104, i.e., by four orders of magnitude, than when it is in the crystalline phase. Here, since the layer 10 is formed by plasma deposition or like process, the layer often exhibits, depending on the plasma process used, a different resistance value than the resistance value determined by the resistivity and shape of the material.

The resistive layer 12 is formed so as to have a resistance value larger than the resistance value of the phase-change material layer 10 in the crystalline phase, but smaller than the resistance value in the amorphous phase. Examples of materials achieving such a resistive layer 12 include C, W, Mo, TiN, and TiW. When the phase-change material layer 10 is formed from a chalcogenide having the resistivity ρ as described above, the resistive layer 12 can be chosen to have a resistivity of about $10^{-2}$ to $10^{-1}$ Ωm. The resistive layer 12 is formed by depositing a resistive material such as described above over the phase-change material layer 10, for example, by plasma deposition.

Figure 2:
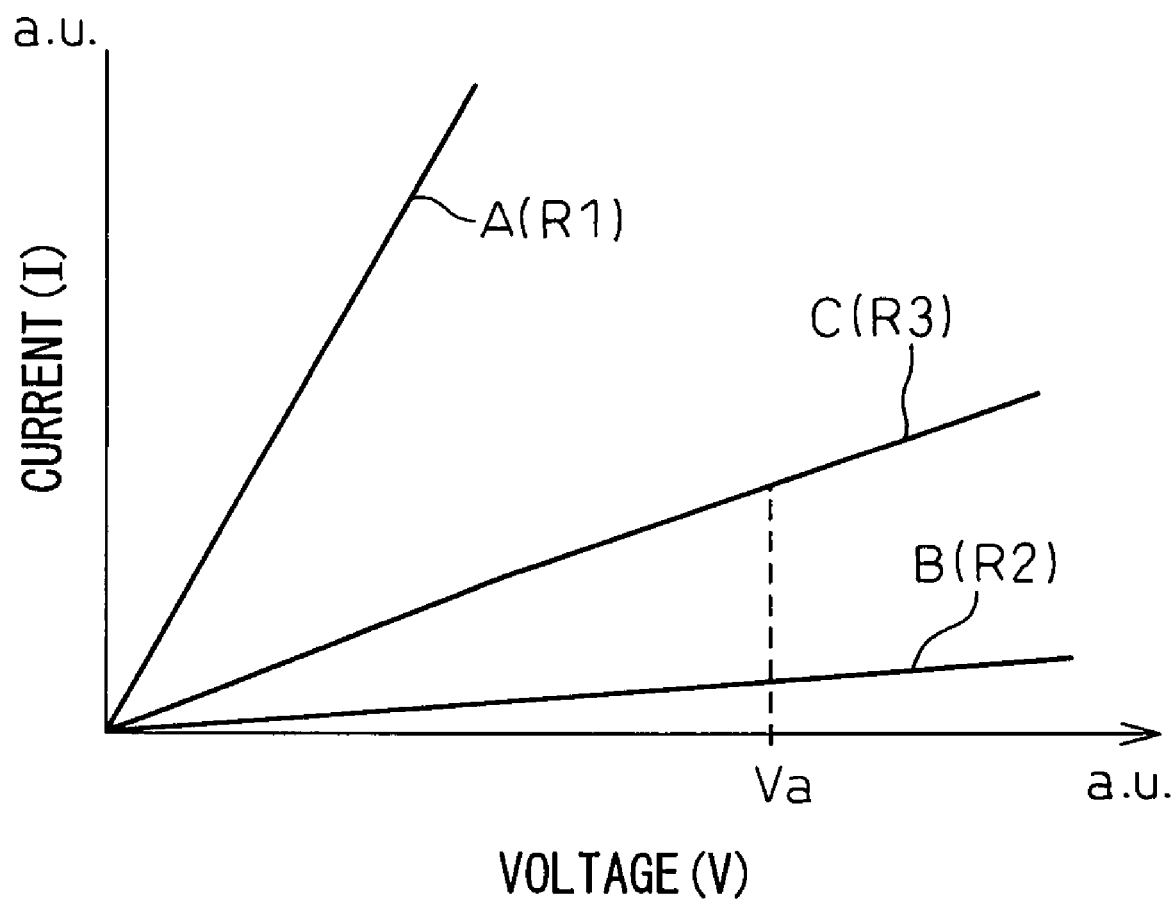
FIG. 2 is a diagram showing the voltage-current characteristics of the phase-change memory device shown in FIG. 1.

FIG. 2 shows by way of example the voltage-current characteristics of the phase-change material layer 10 and the resistive layer 12. In FIG. 2, A shows the voltage-current characteristic when the phase-change material layer 10 is in the crystalline phase and its resistance value is R1, B shows the voltage-current characteristic when the phase-change material layer 10 is in the amorphous phase and its resistance value is R2, and C shows the voltage-current characteristic of the resistive layer 12 having a resistance value R3. The resistance value R3 of the resistive layer 12 is chosen to satisfy the relation R1<R3<R2.

In FIG. 1(A), since the phase-change material layer 10 is in the amorphous state, its resistance value R2 is larger than the resistance value R3 of the resistive layer 12, for example, by a factor of 10. Accordingly, the combined resistance of the memory part 14 is almost the same as the resistance value R3 of the resistive layer 12, and when voltage is applied between the first and second electrodes, the current flows mainly through the resistive layer 12 as indicated by a dashed line "a" in the figure. As a result, the resistive layer 12 generates Joule heat to heat the phase-change material layer 10. With this heat, the phase-change material layer 10 is heated indirectly, and thus undergoes a phase change from amorphous to crystalline.

As shown in FIG. 2, when the same voltage Va is applied to the single layer of amorphous (shown by straight line B) and the composite layer consisting of the amorphous layer and the resistive layer (shown by straight line C), the current flowing through the former greatly differs from the current flowing through the latter. Since Joule heating is determined by the power consumed, i.e., I×V, increasing the current I permits a corresponding reduction in the voltage V for the same quantity of heat. Accordingly, in the memory layer consisting of the resistive layer and the phase-change material layer stacked atop each other, the phase-change material layer can be heated for a phase change with a lower applied voltage.

On the other hand, when the phase-change material layer 10 has changed to the crystalline phase, as shown in FIG. 1(B), its resistance value decreases, for example, by three orders of magnitude compared with that in the amorphous phase, and drops to R1. As a result, the combined resistance of the memory part 14 becomes almost the same as the resistance R1, and the current now flows through the phase-change material layer 10, as shown by dashed line "b" in the figure. Accordingly, when causing a phase change from crystalline to amorphous, there is little need to consider the presence of the resistive layer 12.

The following describes in detail how the applied voltage required to cause a phase change from amorphous to crystalline can be reduced by the presence of the resistive layer 12.

The quantity of Joule heat is determined by the power P applied to the resistive body. Here, the power P is given as $P=IV=V^2/R$ To obtain the same power P when the phase-change material layer 10 is in the high resistance amorphous phase as when it is in the low resistance crystalline phase, voltage V1 (applied voltage to the crystalline phase) and voltage V2 (applied voltage to the amorphous phase) must satisfy the relation $P=V1^2/R1=V2^2/R2$ Accordingly, the voltage V2 applied to the amorphous phase is $V2=(R2/R1)^{1/2} \cdot V1$ Thus, the voltage V2 must be set $(R2/R1)^{1/2}$ times the voltage V1. With the present state of the art, since R2/R1=$10^2$ to $10^4$, the voltage V2 must be set 10 to 100 times the voltage V1.

By contrast, when the memory part 14 is formed by stacking the phase-change material layer 10 and the resistive layer 12 one on top of the other, since the combined resistance of the memory part 14 when the phase-change material layer 10 is in the amorphous state is almost the same as the resistance value R3 of the resistive layer 12, the voltage V3 necessary to obtain the power P is $V3=(R3/R1)^{1/2} \cdot V1$ which means that, when R3/R1 is 5 or less, the voltage V3 need only be set about 2.2 times the voltage V1. As a result, while in the prior art, an applied voltage of 5 V or higher has been required in order to cause the phase change from amorphous to crystalline, in the present embodiment the phase change can be effected with a voltage lower than 5 V.

Figure 3:
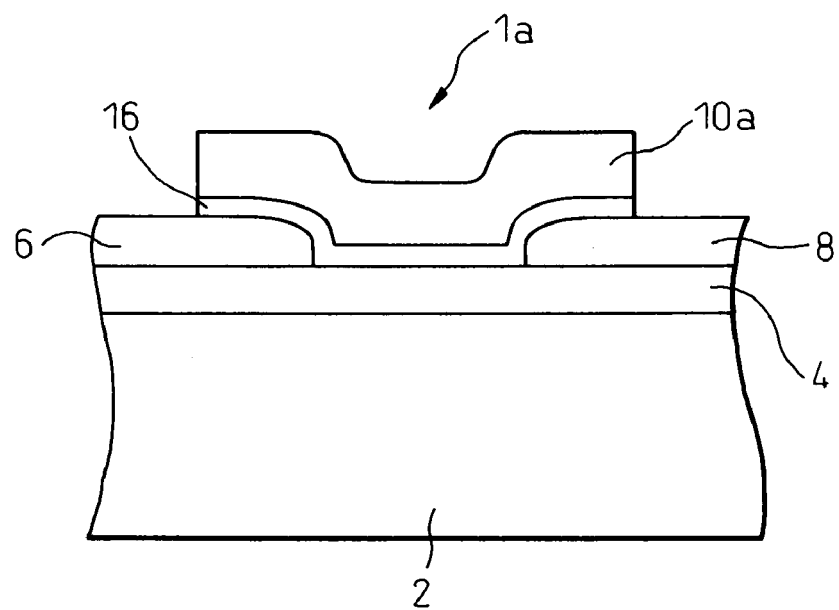
FIG. 3(A) is a diagram showing an alternative example of the phase-change memory device shown in FIG. 1.
FIG. 3(B) is a diagram showing a further alternative example of the phase-change memory device shown in FIG. 1.
Figure 3:
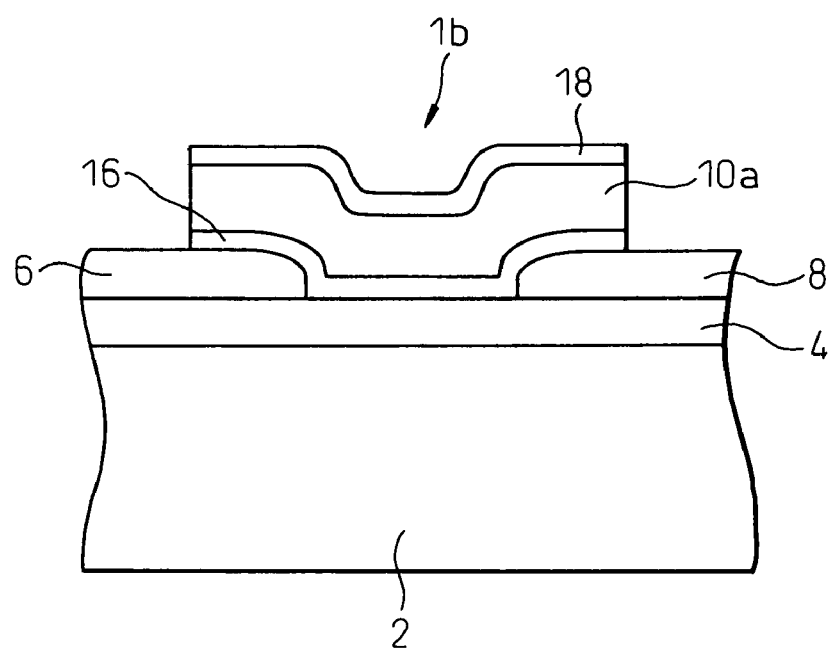

FIGS. 3(A) and 1(B) show alternative examples of the stacked-type phase-change memory device according to the present embodiment. In the drawings given hereinafter, the same reference numerals as those in FIG. 1 designate the same or similar constituent elements. The phase-change memory device 1a shown in FIG. 3(A) has a structure in which first a resistive layer 16 is formed between the first and second electrodes 6 and 8, and then a phase-change material layer 10a is formed on top of it. The phase-change memory device 1b shown in FIG. 3(B) is similar in structure to the above device shown in FIG. 3, except that a second resistive layer 18 is formed on top of the phase-change material layer 10a, thus sandwiching the phase-change material layer 10a between the two resistive layers 16 and 18. This structure makes it much easier to control the resistance value of the memory part. Furthermore, since the upper surface of the phase-change material layer 10a is covered with the resistive layer 18, as in the case of the phase-change memory device shown in FIG. 1, the phase-change material liquefied to amorphize the phase-change material layer 10a can be prevented from scattering around. In the structure of FIG. 3(B), an insulating layer may be provided instead of the resistive layer 18.

Embodiment 2

Figure 4:
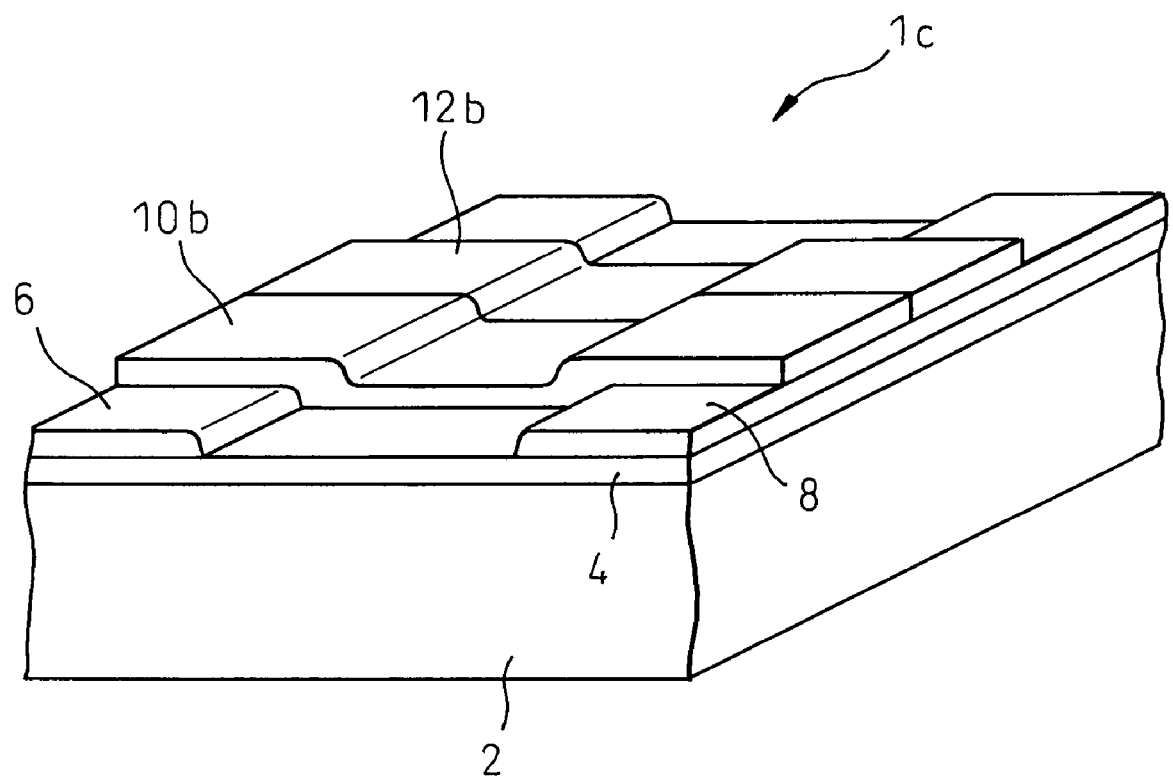
FIG. 4 is a perspective view showing a phase-change memory device according to a second embodiment of the present invention.

FIG. 4 is a perspective view showing the structure of a parallel-type phase-change memory device according to a second embodiment of the present invention. The device 1c of this embodiment has a structure in which a phase-change material layer 10b and a resistive layer 12b are arranged in parallel and adjacent to each other between the first and second electrodes 6 and 8 formed on the insulating layer 4. Though not shown here, a protective layer may be formed over the phase-change material layer 10b and the resistive layer 12b. The electrical properties of the phase-change material layer 10b and the resistive layer 12b are the same as those of the corresponding layers in the stacked-type phase-change memory device of the first embodiment described above. Accordingly, in the memory device of this structure also, when the phase-change material layer 10b is in the amorphous state, the current flows mainly through the resistive layer 12b between the first and second electrodes 6 and 8, and the phase-change material layer 10b is heated indirectly by the heating of the resistive layer. As a result, as in the memory device of the first embodiment, the applied voltage necessary to cause the phase-change material layer 10b to change from the amorphous phase to the crystalline phase can be reduced. When causing the phase-change material layer 10b to change from the crystalline phase to the amorphous phase, the presence of the resistive layer 12 does not have any effect on it because current flows mainly through the phase-change material layer 10b.

Embodiment 3

Figure 5:
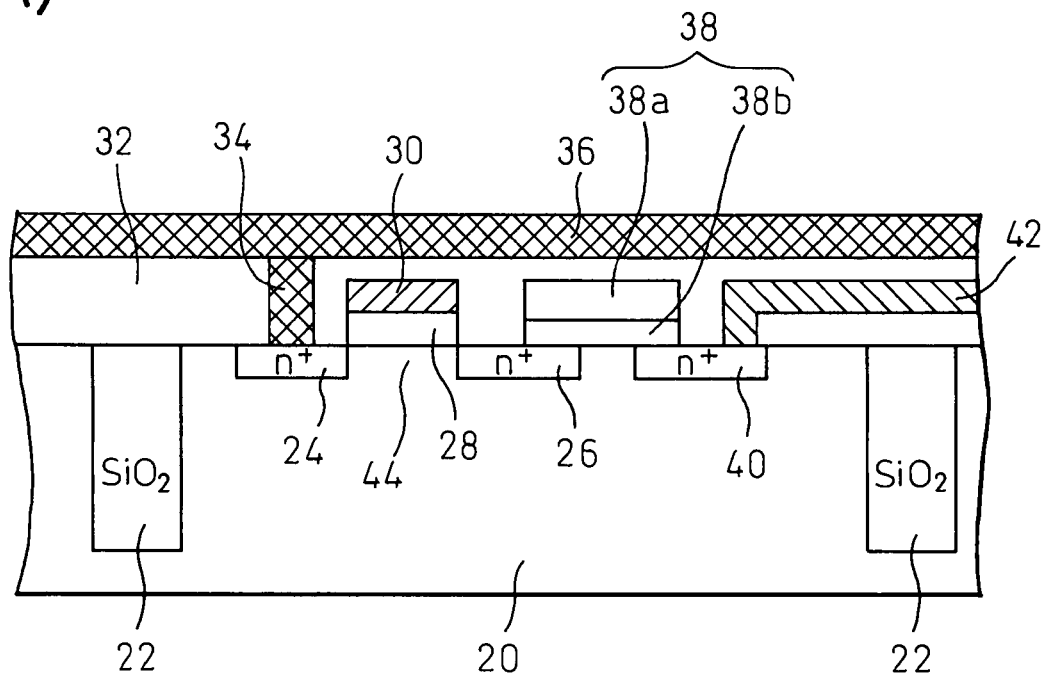
FIG. 5(A) is a cross-sectional view of a memory cell array according to a third embodiment of the present invention.
FIG. 5(B) is a cross-sectional view of an alternative example of the memory cell array according to the third embodiment of the present invention.
Figure 5:
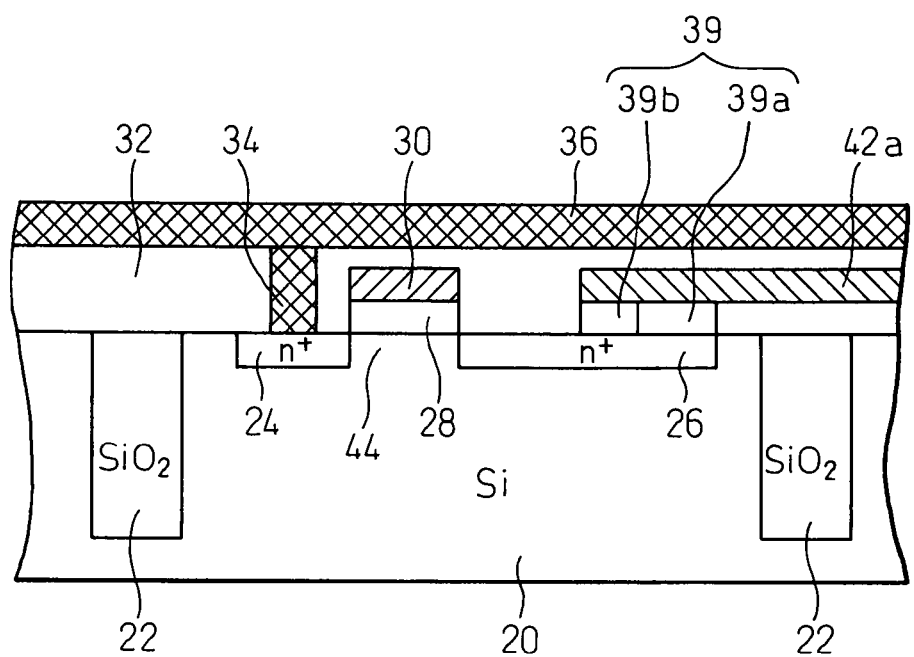

FIGS. 5(A) and 5(B) are partial cutaway cross-sectional views showing the structure of a memory cell array (PRAM) according to a third embodiment of the present invention. Only one memory cell of the PRAM is shown here, but actually, a plurality of memory cells are formed on the same substrate, forming an integrated circuit having a large storage capacity. Wiring structures in such memory cell arrays are well known, and will not be described here.

In FIG. 5(A), reference numeral 20 is an Si semiconductor substrate, 22 is an SiO$_2$ layer for device isolation, 24 and 26 are, for example, n+ diffusion layers, 28 is a gate insulating film, and 30 is a gate electrode. The n+ diffusion layer 24 is connected to a bit line 36 via a plated hole 34 formed through an interlayer insulating film 32. On the other diffusion layer 26 is formed a stacked-type memory part according to the first embodiment or a parallel-type memory part 38 according to the second embodiment. In the illustrated example, the memory part 38 has a stacked structure consisting of a phase-change material layer 38a and a resistive layer 38b, and the diffusion layers 26 and 40 form the first and second electrodes. The memory device of the first embodiment is thus constructed. The other end of the memory part 38 is connected to a source line 42 via the n+ diffusion layer 40.

The diffusion layers 24 and 26 and the gate electrode 30 together form a MOS transistor, and current conduction through a channel region 44 formed in the Si semiconductor substrate 20 directly below the gate is controlled on and off by the voltage applied to the gate electrode 30. More specifically, when selecting the memory part 38, the channel region 44 is placed in a conducting state by controlling the voltage to the gate electrode 30, thus supplying power to the memory part. On the other hand, when deselecting the memory part, an OFF voltage is applied to the gate electrode 30.

Accordingly, when the channel region 44 is made to conduct by controlling the gate voltage of the MOS transistor, a write voltage (a voltage for causing a phase change) or a read voltage is applied to the memory part 38 via the bit line 36, and conversely, when the channel region 44 is placed in a nonconducting state, the write or read voltage is not applied. The gate electrode 30 is connected to a word line not shown.

FIG. 5(B) is a diagram showing an alternative example of the memory cell array structure according to the third embodiment. This memory cell array is characterized by the inclusion of a memory part having a vertical-type electrode structure in place of the memory part shown in FIG. 5(A). The memory part 39 here has a structure in which a phase-change material layer 39a and a resistive layer 39b are formed in parallel and adjacent to each other on the n+ layer 26, the n+ layer 26 forms one electrode, and the source line 42a forms the other electrode. In this memory cell array also, information can be written to and read from the memory part 39 in the same manner as in the memory cell array shown in FIG. 5(A).

In the memory cell arrays shown in FIGS. 5(A) and 5(B), as explained in the description of the first and second embodiments, the voltage required to cause the phase-change material layer in the memory part 38 or 39 to change from the amorphous to the crystalline phase is greatly reduced compared with the case where the resistive layer is not formed. As a result, a memory cell array whose driving power is small can be achieved.

Embodiment 4

Figure 6:
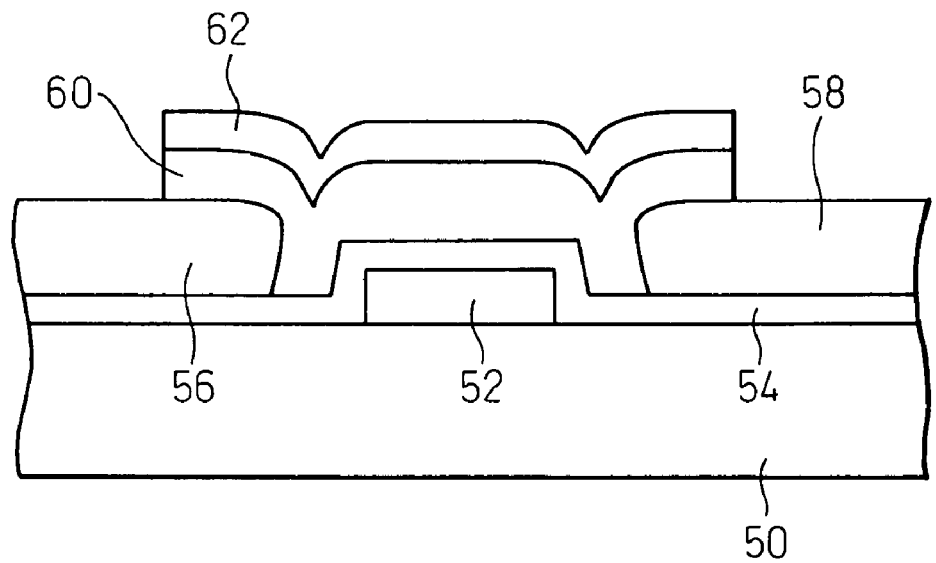
FIG. 6 is a cross-sectional view of a phase-change channel transistor according to a fourth embodiment of the present invention.
Figure 7:
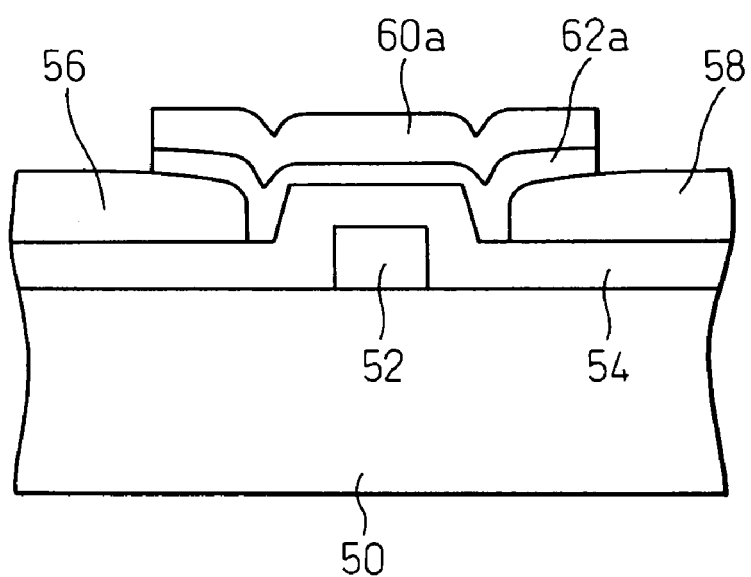
FIG. 7 is a diagram showing one example of the phase-change channel transistor shown in FIG. 6.
Figure 8:
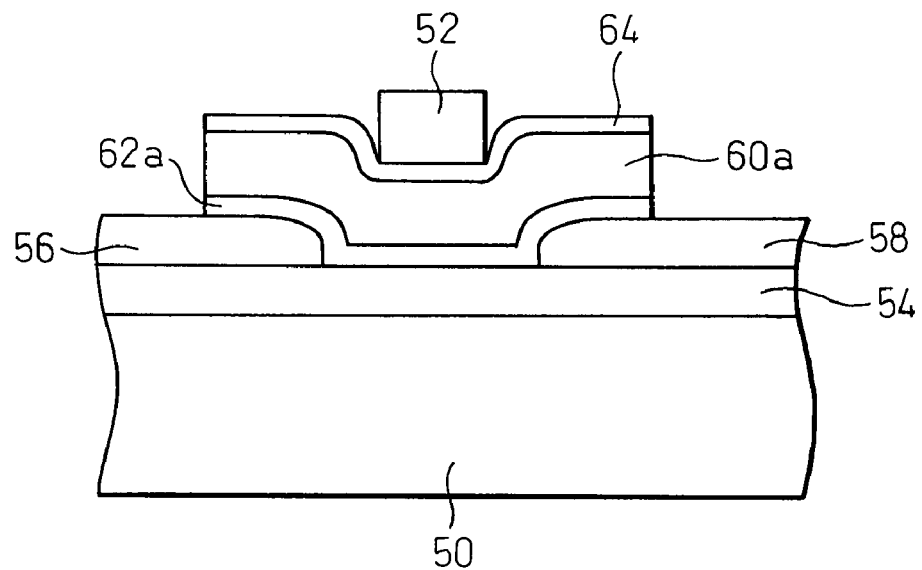
FIG. 8(A) is a diagram showing an alternative example of the phase-change channel transistor shown in FIG. 6.
FIG. 8(B) is a diagram showing a further alternative example of the phase-change channel transistor shown in FIG. 6.
Figure 8:
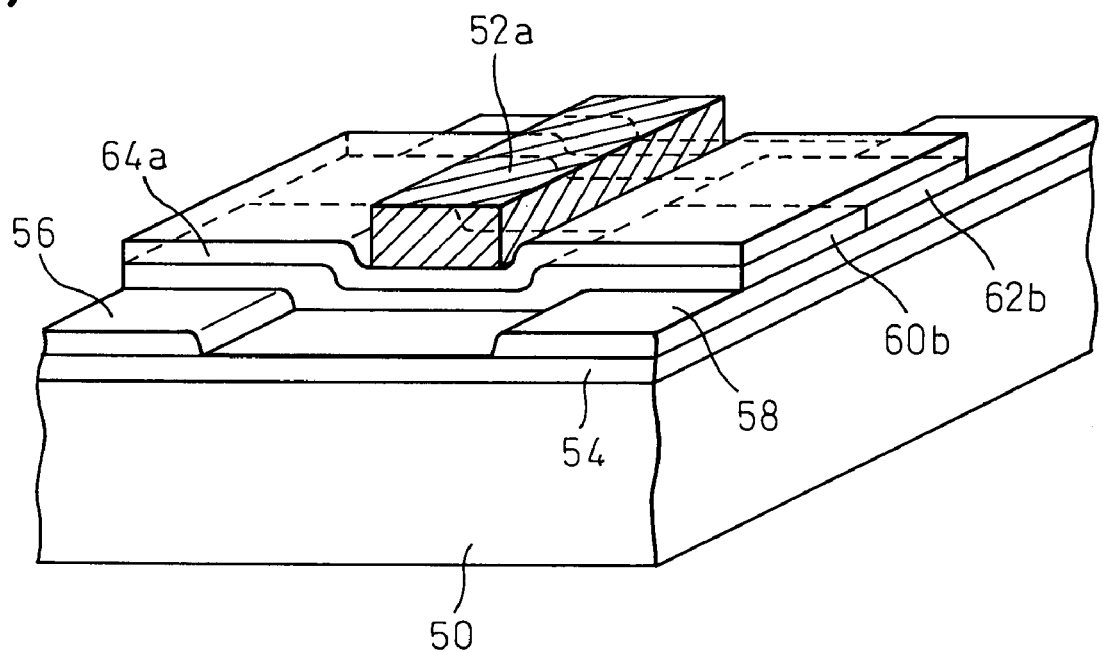

FIGS. 6 to 8 are partially cutaway cross-sectional views showing first to fourth examples of a phase-change channel transistor according to a fourth embodiment of the present invention. In FIGS. 6 to 8, reference numeral 50 is a semiconductor substrate, 52 is a gate electrode, 54 is an insulating film of SiO$_2$ or the like, 56 is a source electrode, and 58 is a drain electrode. In the first example shown in FIG. 6, a phase-change material layer 60 is formed on the gate electrode 52 with the insulating layer 54 interposed therebetween, and a resistive layer 62 is formed on top of it. In the second example shown in FIG. 7, a resistive layer 62a is formed on the gate electrode 52 with the insulating film 54 interposed therebetween, and a phase-change material layer 60a is formed on top of it. In the third example shown in FIG. 8(A), the gate electrode is not formed on the semiconductor substrate 50, but formed as a gate electrode 52a on the phase-change material layer 60a with an insulating film 64 interposed therebetween. In the fourth embodiment shown in FIG. 8(B), the phase-change channel transistor is constructed by forming a phase-change material layer 60b and a resistive layer 62b in parallel and adjacent to each other between the first and second electrode layers 56 and 58. In this phase-change channel transistor, an insulating film 64a is formed over the phase-change material layer 60*b* and the resistive layer 62*b*, and the gate electrode 52*a* is formed on top of it.

In the phase-change channel transistor shown in each of FIGS. 6 to 8, the transistor is caused to function as a memory by setting the phase-change material layer 60 or 60*a* in an amorphous phase or a crystalline phase. Read/write operations here can be controlled in the same manner as in the phase-change memory device of the first embodiment. Further, by forming the memory part with the phase-change material layer and at least one resistive layer stacked atop each other or arranged in parallel to each other between the source and drain electrodes 56 and 58, the voltage required to cause the phase-change material layer to change from amorphous to crystalline is reduced. Accordingly, the materials and resistance values of the phase-change material layer and the resistive layer are chosen and set in the same manner as in the phase-change memory device of the first embodiment.

Figure 9:
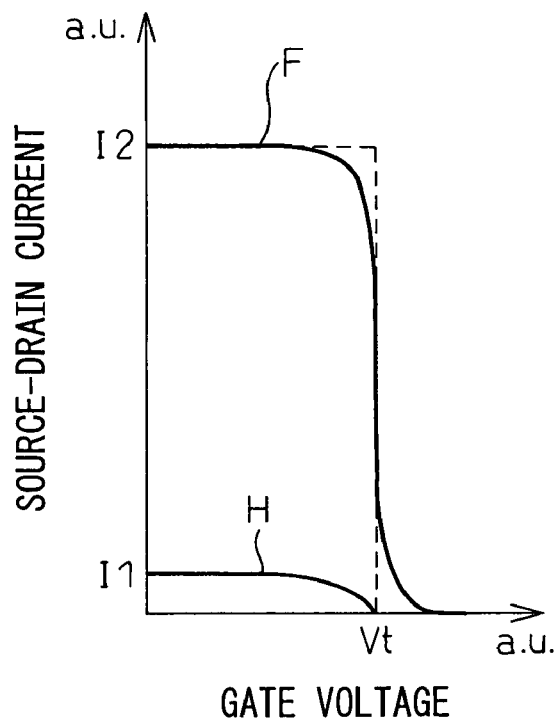
FIG. 9 is a diagram for explaining the switching function of the phase-change channel transistor shown in FIGS. 6 to 8.

The phase-change channel transistor according to the present embodiment not only has the memory function but also has the switching function as a transistor. FIG. 9 shows in schematic form the relationship between the gate voltage and the source-drain current for the phase-change channel transistors shown in FIGS. 6 to 8. The gate voltage is the voltage between the gate 52 or 52*a* shown in FIGS. 6 to 8 and the source electrode 56 or drain electrode 58. The curve F in FIG. 9 shows the gate voltage versus source-drain current (channel current) relationship when the phase-change material layer 60 or 60*a* is in the crystalline phase, while the curve H shows the gate voltage versus source-drain current relationship when the phase-change material layer 60 or 60*a* is in the amorphous phase.

As shown, in the channel formed from the phase-change material layer 60 or 60*a*, if the gate voltage is lower than a predetermined value Vt, a substantially constant current I1 (in the case of amorphous phase) or I2 (in the case of crystalline phase), which is determined depending on whether the layer 60 or 60*a* is in the amorphous phase or crystalline phase, flows through the channel region irrespectively of the gate voltage, but if the gate voltage exceeds the voltage Vt, very little channel current flows. Accordingly, by controlling voltage applied to the gate electrode 52 or 52*a*, each of the devices shown in FIGS. 6 to 8 can be made to also function as a switching device.

This switching function of the phase-change material is described in detail in the previously cited Japanese Unexamined Patent Publication No. 2005-93619.

Embodiment 5

Figure 10:
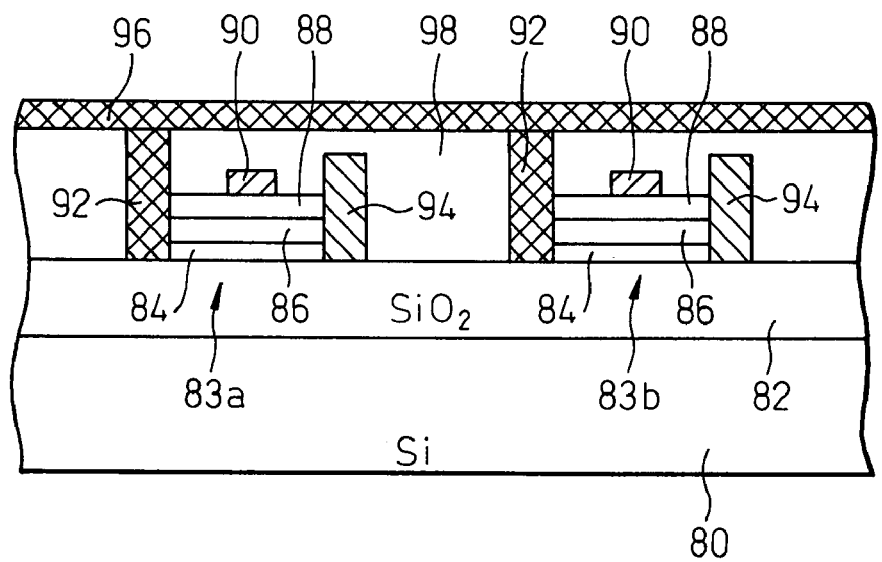
FIG. 10 is a diagram showing a memory cell array according to a fifth embodiment of the present invention.

FIG. 10 is a partial cutaway cross-sectional view showing the structure of a memory cell array using the phase-change channel transistor of the fourth embodiment described above; two memory cells are shown here. In the figure, reference numeral 80 is an Si semiconductor substrate, and 82 is an insulating film of $SiO_2$ or the like, and the phase-change channel transistors 83*a* and 83*b* of the structure shown in FIG. 8 are fabricated on the insulating film 82. The phase-change channel transistors 83*a* and 83*b* each comprise a resistive layer 84 formed from a resistive material, a phase-change material layer 86 formed from a phase-change material, a gate insulating film 88, a gate electrode 90, and first and second electrodes 92 and 94 forming the source and drain electrodes.

The gate electrode 90 is connected to a word line not shown, the first electrode 92 is connected to a bit line 96, and the second electrode 94 is connected to a source line not shown. Reference numeral 98 indicates an interlayer insulating film. The resistive layer 84 and the phase-change material layer 86 together form a memory part which stores information based on whether the phase-change material layer 86 is in the amorphous phase or in the crystalline phase. Switching voltage for switching the transistor 83*a* or 83*b* on and off is applied to the gate electrode 90 via the word line. Voltage for reading or writing to the memory part is applied between the bit line 96 and the source line. Accordingly, by selecting and driving the bit line and the word line, the desired transistor in the memory array is selected and the writing, reading, or erasure of information is performed.

In the memory array of FIG. 10, since each memory part is constructed from a stacked or parallel structure consisting of the resistive layer 84 and the phase-change material layer 86, there is offered an enormous advantage that can reduce the voltage required to cause the phase-change material layer 86 to change from the amorphous to the crystalline phase, as earlier noted for the phase-change memory devices of the first and second embodiments. Furthermore, since the transistor forming the memory part has the switching function, there is no need to provide a select transistor for addressing the desired transistor. As a result, compared with the traditional memory cell array that requires the provision of the select transistor in addition to the memory part, the area of each memory cell can be greatly reduced. Accordingly, memory cells can be fabricated at a much higher density on the same substrate.

In any of the above embodiments, for the phase-change material, use can be made not only of GeSbTe, but also of such materials as GaSb, InSb, InSe, SbTe, GeTe, InSbTe, GaSeTe, SnSbTe, InSbGe, AgInSbTe, GeSnSbTe, GeSbSeTe, and TeGeSbS. In each material, the composition ratio can be changed variously. Examples of the resistive layer material include C, W, Mo, TiN, TiW, etc., and for the insulating film material, use can be made of $SiO_2$, $Si_3N_4$, ZnS, etc.

What is claimed is:

1. A phase-change memory device comprising:
a semiconductor substrate;
an insulating film formed on the semiconductor substrate;
a first electrode and a second electrode, both formed separately from each other on the insulating film so that a part of a surface of the insulating film is exposed;
a phase-change material layer formed to cover at least a part of the exposed surface of the insulating film and to be in contact with the first electrode and the second electrode; and
a resistive layer formed to cover a surface of the phase-change material layer, wherein
the phase-change material layer is made of a phase-change material which is stable in at least one of an amorphous phase and a crystalline phase at room temperature, and wherein
the resistance value of the resistive layer is smaller than the resistance value that the phase-change material layer exhibits in the amorphous phase, but is larger than the resistance value that the phase-change material layer exhibits in the crystalline phase.

2. A phase-change memory device as claimed in claim 1, wherein the phase-change material layer is formed from a chalcogenide-based material.

3. A phase-change memory device as claimed in claim 1, wherein the resistive layer includes at least one element selected from the group consisting of C, W, Mo, TiN, and TiW.

4. A phase-change memory device as claimed in claim 1, wherein the resistive layer is covered with a protective layer.

5. A memory cell array comprising:
a plurality of memory cells arranged on a single substrate, each of the memory cells comprising a single MOS transistor and a memory part, the memory part being formed from a phase-change memory device comprising
- a semiconductor substrate,
- an insulating film formed on the semiconductor substrate,
- a first electrode and a second electrode, both formed separately from each other on the insulating film so that a part of a surface of the insulating film is exposed,
- a phase-change material layer formed to cover at least a part of the exposed surface of the insulating film and to be in contact with the first electrode and the second electrode, and
- a resistive layer formed to cover a surface of the phase-change material layer, wherein
the phase-change material layer is made of a phase-change material which is stable in at least one of an amorphous phase or a crystalline phase at room temperature, and wherein
the resistance value of the resistive layer is smaller than the resistance value that the phase-change material layer exhibits in the amorphous phase, but is larger than the resistance value that the phase-change material layer exhibits in the crystalline phase.

* * * * *